United States Patent
Joo et al.

(10) Patent No.: US 9,997,624 B2
(45) Date of Patent: Jun. 12, 2018

(54) SEMICONDUCTOR DEVICE AND METHOD OF MANUFACTURING THE SAME

(71) Applicant: HYUNDAI MOTOR COMPANY, Seoul (KR)

(72) Inventors: NackYong Joo, Hanam-si (KR); Youngkyun Jung, Seoul (KR); Junghee Park, Suwon-si (KR); JongSeok Lee, Suwon-si (KR); Dae Hwan Chun, Gwangmyeong-si (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 0 days. days.

(21) Appl. No.: 15/348,613

(22) Filed: Nov. 10, 2016

(65) Prior Publication Data
US 2018/0012991 A1    Jan. 11, 2018

(30) Foreign Application Priority Data
Jul. 5, 2016   (KR) ........................ 10-2016-0084838

(51) Int. Cl.
| | | |
|---|---|---|
| *H01L 29/78* | (2006.01) | |
| *H01L 21/265* | (2006.01) | |
| *H01L 29/16* | (2006.01) | |
| *H01L 29/45* | (2006.01) | |
| *H01L 29/49* | (2006.01) | |
| *H01L 29/66* | (2006.01) | |

(52) U.S. Cl.
CPC .... *H01L 29/7813* (2013.01); *H01L 21/26586* (2013.01); *H01L 29/1608* (2013.01); *H01L 29/45* (2013.01); *H01L 29/4916* (2013.01); *H01L 29/66068* (2013.01)

(58) Field of Classification Search
CPC ........................ H01L 29/1608; H01L 29/7813
See application file for complete search history.

(56) References Cited

U.S. PATENT DOCUMENTS

| | | | |
|---|---|---|---|
| 8,680,611 B2 | 3/2014 | Kocon et al. | |
| 2010/0176443 A1* | 7/2010 | Takaishi .............. | H01L 29/7828 257/328 |

FOREIGN PATENT DOCUMENTS

| | | |
|---|---|---|
| KR | 10-2011-0046266 A | 5/2011 |
| KR | 10-2011-0084166 A | 7/2011 |
| KR | 10-2013-0020120 A | 2/2013 |
| KR | 10-1361239 B1 | 2/2014 |
| KR | 10-1380113 B1 | 4/2014 |

* cited by examiner

*Primary Examiner* — Daniel Shook
(74) *Attorney, Agent, or Firm* — McDermott Will & Emery LLP

(57) ABSTRACT

A semiconductor device includes: an n− type layer disposed on a first surface of an n+ type silicon carbide substrate; a first trench and a second trench formed in the n− type layer and separated from each other; an n+ type region disposed between a side surface of the first trench and the side surface of the second trench and disposed on the n− type layer; a gate insulating layer disposed inside the first trench; a source insulating layer disposed inside the second trench; a gate electrode disposed on the gate insulating layer; an oxide layer disposed on the gate electrode; a source electrode disposed on the oxide layer, the n+ type region, and the source insulating layer; and a drain electrode disposed on a second surface of the n+ type silicon carbide substrate.

17 Claims, 12 Drawing Sheets

SEMICONDUCTOR DEVICE AND METHOD OF MANUFACTURING THE SAME

CROSS-REFERENCE TO RELATED APPLICATION

This application claims the benefit of priority to Korean Patent Application No. 10-2016-0084838, filed in the Korean Intellectual Property Office on Jul. 5, 2016, the entirety of which is incorporated herein by reference.

TECHNICAL FIELD

The present disclosure relates to a semiconductor device including silicon carbide (SiC) and a manufacturing method thereof.

BACKGROUND

A power semiconductor device should have low turn-on resistance or a low saturation voltage in order to reduce power loss in a conductive state when a large amount of current flows. Furthermore, the power semiconductor device should have a characteristic of enduring an inverse directional high voltage at a PN conjunction thereof, which may be applied to opposite terminals of the power semiconductor device when it is turned off or when a switch is turned off, that is, the power semiconductor device should have a high breakdown voltage characteristic.

When various power semiconductor devices satisfying electrical and physical conditions are packaged in one module, the number of semiconductor devices included in the packaged module and electrical specifications thereof may vary depending on the conditions required by a system.

Generally, a three-phase power semiconductor module is used so as to generate a Lorentz force for driving a motor. That is, the three-phase power semiconductor module controls a current and power applied to the motor, such that a driven state of the motor is determined.

Although conventional silicon insulated gate bipolar transistors (IGBTs) and silicon diodes have been included and used in such a three-phase semiconductor module, the three-phase semiconductor module has recently tended to include silicon carbide (SiC) metal oxide semiconductor field effect transistors (MOSFETs) and silicon carbide diodes in order to minimize power consumption therein and to increase a switching speed thereof.

When the silicon IGBTs or silicon carbide MOSFETs are connected to separate diodes, a plurality of wires are required for the connection, and since parasitic capacitance and inductance occur due to the plurality of wires, the switching speed of the module may be reduced.

The above information disclosed in this Background section is only for the enhancement of understanding of the background of the disclosure and therefore it may contain information that does not form the prior art that is already known in this country to a person of ordinary skill in the art.

SUMMARY

The present disclosure has been made in an effort to provide a silicon carbide semiconductor device including a MOSFET region and a diode region.

According to an exemplary embodiment in the present disclosure, a semiconductor device includes: an n− type layer disposed on a first surface of an n+ type silicon carbide substrate; a first trench and a second trench formed in the n− type layer and separated from each other; an n+ type region disposed between a side surface of the first trench and the side surface of the second trench and disposed on the n− type layer; a gate insulating layer disposed inside the first trench; a source insulating layer disposed inside the second trench; a gate electrode disposed on the gate insulating layer; an oxide layer disposed on the gate electrode; a source electrode disposed on the oxide layer, the n+ type region, and the source insulating layer; and a drain electrode disposed on a second surface of the n+ type silicon carbide substrate.

A p type region disposed on both side surfaces of the second trench may be further included.

The p type region may be disposed between the side surface of the second trench and the n− type layer.

The p type region may enclose a corner of the second trench and may extend under the corner of the second trench.

The n+ type region may be disposed on the n− type layer and the portion of the p type region.

The other portion of the p type region may be disposed between the n+ type region and the side surface of the second trench.

The source insulating layer and the gate insulating layer may include the same material, and the thickness of the source insulating layer may be thinner than the thickness of the gate insulating layer.

The source electrode may include a first source electrode and a second source electrode, the first source electrode may be positioned on the source insulating layer, and the second source electrode may be disposed on the n+ type region, the portion of the p type region, the oxide layer, and the first source electrode.

The first source electrode and the gate electrode may include a polycrystalline silicon, and the second source electrode and the drain electrode may include an ohmic metal.

The gate electrode may include the polycrystalline silicon, and the first source electrode, the second source electrode, and the drain electrode may include the ohmic metal.

The gate insulating layer and the source insulating layer may include the same material, and the thicknesses of the gate insulating layer and the source insulating layer may be the same.

According to another exemplary embodiment in the present disclosure, a manufacturing method of a semiconductor device includes steps of: forming an n− type layer at a first surface of an n+ type silicon carbide substrate; forming an n+ type region on the n− type layer; etching the n+ type region and the n− type layer to form a first trench and a second trench separate from each other; forming a gate insulating layer within the first trench; forming a source insulating layer within the second trench; forming a gate electrode on the gate insulating layer; forming an oxide layer on the gate electrode; forming a source electrode on the oxide layer, the n+ type region, and the source insulating layer; and forming a drain electrode at a second surface of the n+ type silicon carbide substrate.

The manufacturing method of the semiconductor device may further include, before the step of forming the source insulating layer, injecting a p type ion to the side surface of the second trench to form a p type region between the side surface of the second trench and the n− type layer.

A portion of the p type region may be formed under the n+ type region, and another portion of the p type region may be formed between the n+ type region and the side surface of the second trench.

In the step of forming the p type region, the p type ion may be injected by a tilt ion injection method.

As described above, according to an exemplary embodiment in the present disclosure, as the semiconductor device according to the present exemplary embodiment performs the MOSFET operation and the diode operation, wiring connecting the conventional MOSFET element and the conventional diode element is not required. Accordingly, the area of the element may be reduced.

Also, as one semiconductor device performs the MOSFET operation and the diode operation without the wiring, the switching speed of the semiconductor device may be improved and the loss of power may be reduced.

DETAILED DESCRIPTION OF THE EMBODIMENTS

Figure 1:
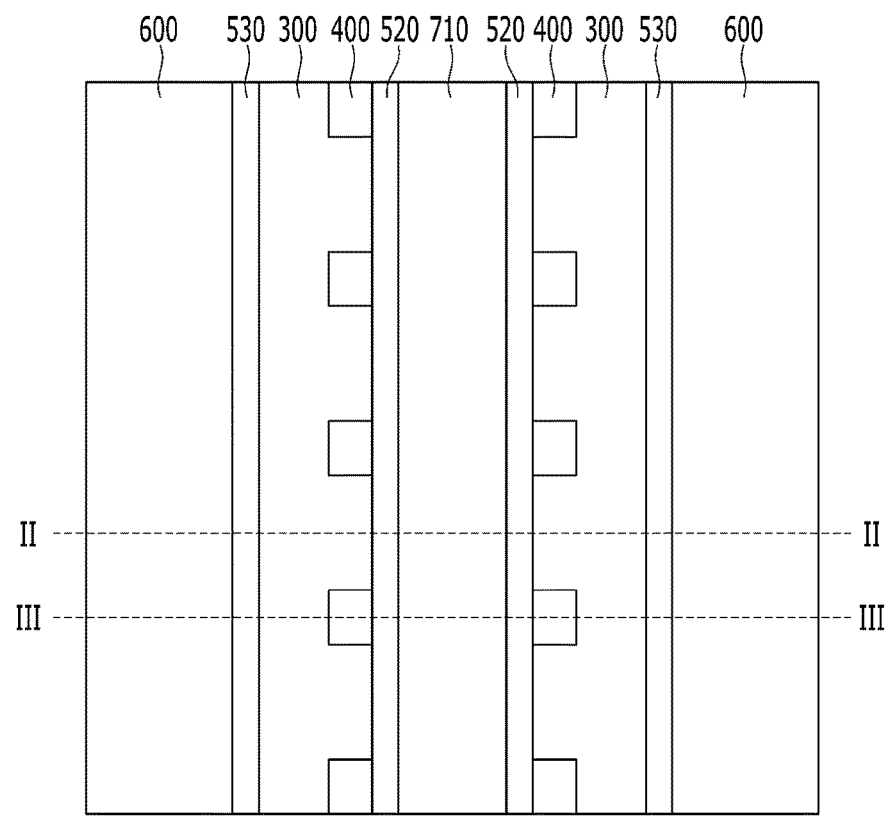
FIG. 1 illustrates a layout view of a semiconductor device according to an exemplary embodiment in the present disclosure.

The present disclosure will be described more fully hereinafter with reference to the accompanying drawings, in which exemplary embodiments of the disclosure are shown. However, it is to be understood that the disclosure is not limited to the disclosed embodiments, but, on the contrary, is intended to cover various modifications. As those skilled in the art would realize, the described embodiments may be modified in various different ways, all without departing from the spirit or scope of the present disclosure.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present.

Figure 2:
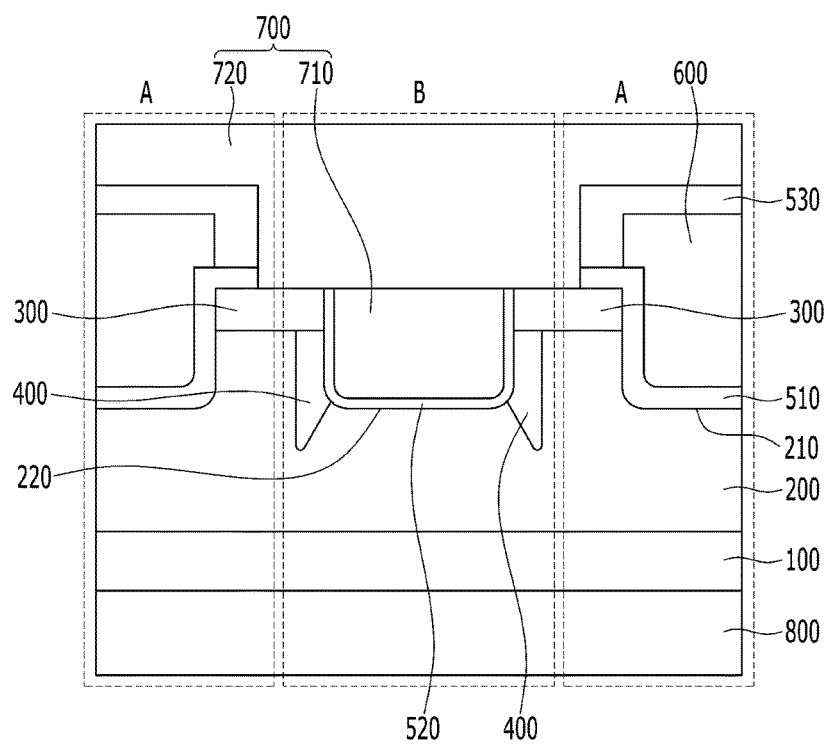
FIG. 2 illustrates a cross-sectional view taken along line II-II of FIG. 1.
Figure 3:
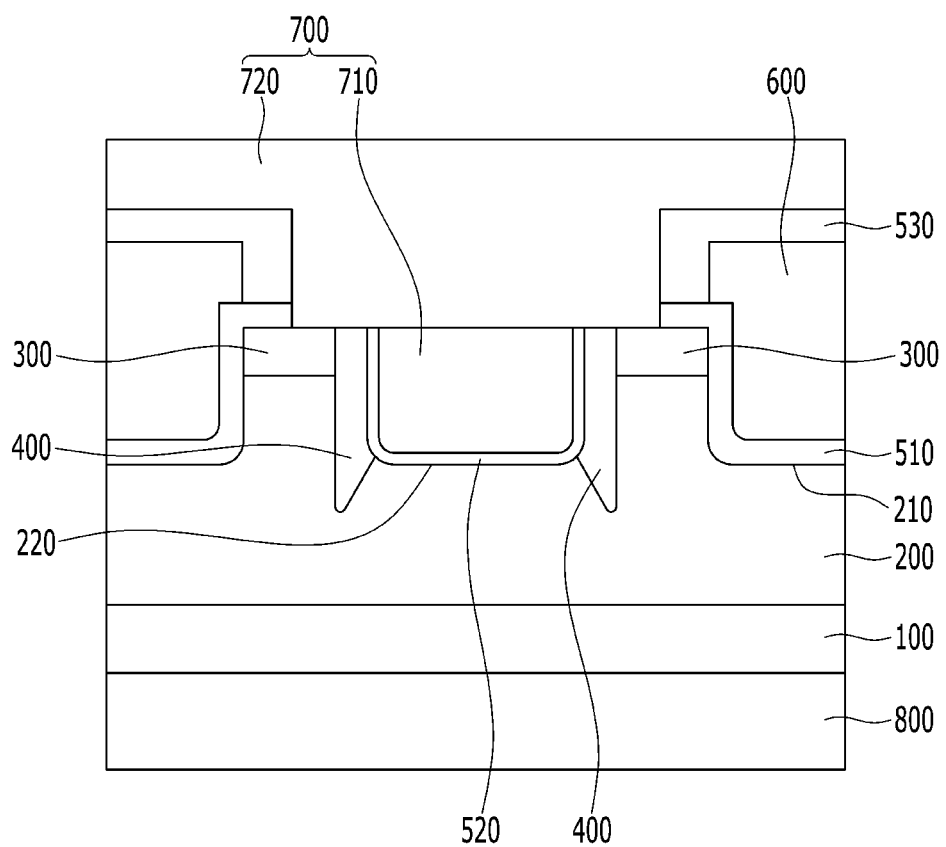
FIG. 3 illustrates a cross-sectional view taken along line III-III of FIG. 1.

FIG. 1 illustrates a layout view of a semiconductor device according to an exemplary embodiment in the present disclosure. FIG. 2 illustrates a cross-sectional view taken along line II-II of FIG. 1. FIG. 3 illustrates a cross-sectional view taken along line III-III of FIG. 1.

Referring to FIGS. 1 to 3, a semiconductor device according to the present exemplary embodiment includes a MOSFET (Metal Oxide Silicon Field Effect Transistor) region A and a diode region B.

The detailed structure of the semiconductor device according to the present exemplary embodiment will now be described.

The semiconductor device according to the present exemplary embodiment includes an n+ type silicon carbide substrate 100, an n− type layer 200, an n+ type region 300, a p type region 400, a gate electrode 600, a source electrode 700, and a drain electrode 800.

The n− type layer 200 is disposed on a first surface of the n+ type silicon carbide substrate 100, and a first trench 210 and a second trench 220 separated from each other are positioned in the n− type layer 200.

The p type region 400 is disposed at both side surfaces of the second trench 220. The p type region 400 is disposed between the side surface of the second trench 220 and the n− type layer 200. The p type region 400 encloses a corner of the second trench 220 and extends to the bottom of the corner of second trench 220. By this structure, an electric field is concentrated at the bottom of the p type region 400, thereby preventing the electric field from being concentrated at the corner of the second trench 220. On the other hand, the p type region 400 does not exist under the lower surface of the second trench 220.

The n+ type region 300 is disposed between the side surface of the first trench 210 and the side surface of the second trench 220, and is disposed on the n− type layer 200. Also, the n+ type region 300 is disposed on a portion of the p type region 400 (referring to FIG. 2). Another portion of the p type region 400 is disposed between the n+ type region 300 and the side surface of the second trench 220. In this case, an extension line of the upper surface of the other portion of the p type region 400 is the same as an extension line of the upper surface of the n+ type region 300 (referring to FIG. 3).

A gate insulating layer 510 is disposed within the first trench 210, and a source insulating layer 520 is disposed within the second trench 220. The gate insulating layer 510 and the source insulating layer 520 may include the same material, and the thickness of the source insulating layer 520 may be thinner than the thickness of the gate insulating layer 510. The electric field may be prevented from being concentrated at the corner of the second trench 220 by the structure in which the p type region 400 encloses the corner of the second trench 220 such that the thickness of the source insulating layer 520 may be formed to be thinner than the thickness of the gate insulating layer 510. However, it is not limited thereto, and the thickness of the source insulating layer 520 may be the same as the thickness of the gate insulating layer 510.

The gate electrode 600 is disposed on the gate insulating layer 510. The gate electrode 600 fills the inside of the first trench 210 and may protrude to the upper side of the first trench 210. The gate electrode 600 may include a polycrystalline silicone or a metal.

An oxide layer 530 is disposed on the gate electrode 600. The oxide layer 530 covers the side surface of the gate electrode 600 protruding from the first trench 210.

The source electrode 700 is disposed on the n+ type region 300, the portion of the p type region 400, the oxide layer 530, and the source insulating layer 520, and includes a first source electrode 710 and a second source electrode 720. The first source electrode 710 is disposed on the source insulating layer 520 and fills the inside of the second trench 220. The second source electrode 720 is disposed on the n+ type region 300, the portion of the p type region 400, the oxide layer 530, and the first source electrode 710.

Here, the first source electrode 710 may include the polycrystalline silicon and the second source electrode 720 may include the metal. In this case, the metal may be an ohmic metal. Further, in the present exemplary embodiment, it is described that the first source electrode 710 and the second source electrode 720 include different materials, however it is not limited thereto, and the first source electrode 710 and the second source electrode 720 may include the same metal. In this case, the metal may be the ohmic metal.

The drain electrode 800 is disposed on the second surface of the n+ type silicon carbide substrate 100. Here, the second surface of the n+ type silicon carbide substrate 100 means an opposite surface from the first surface of the n+ type silicon carbide substrate 100. The drain electrode 800 may include the metal. In this case, the metal may be the ohmic metal.

Referring to FIG. 2, the source electrode 700, the gate electrode 600, the n+ type region 300, the n− type layer 200, the n+ type silicon carbide substrate 100, and the drain electrode 800 form the MOSFET region A, and the source electrode 700, the n+ type region 300, the p type region 400, the n− type layer 200, the n+ type silicon carbide substrate 100, and the drain electrode 800 form the diode region B.

The operation of the MOSFET and the operation of the diode are realized in the semiconductor device according to the present exemplary embodiment. In this case, the operation of the MOSFET and the operation of the diode region may be separately performed depending on a voltage application state.

The operation of the semiconductor device will be described with reference to FIG. 4 to FIG. 6.

Figure 4:
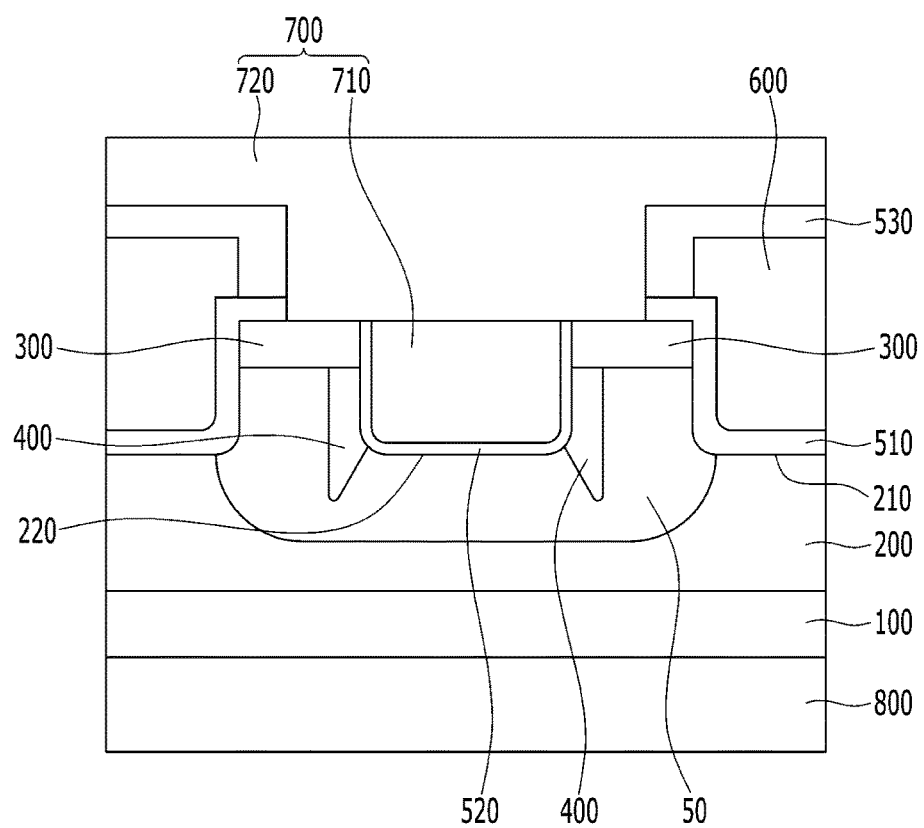
FIG. 4 is a view showing an off state of the semiconductor device shown in FIG. 1.
Figure 5:
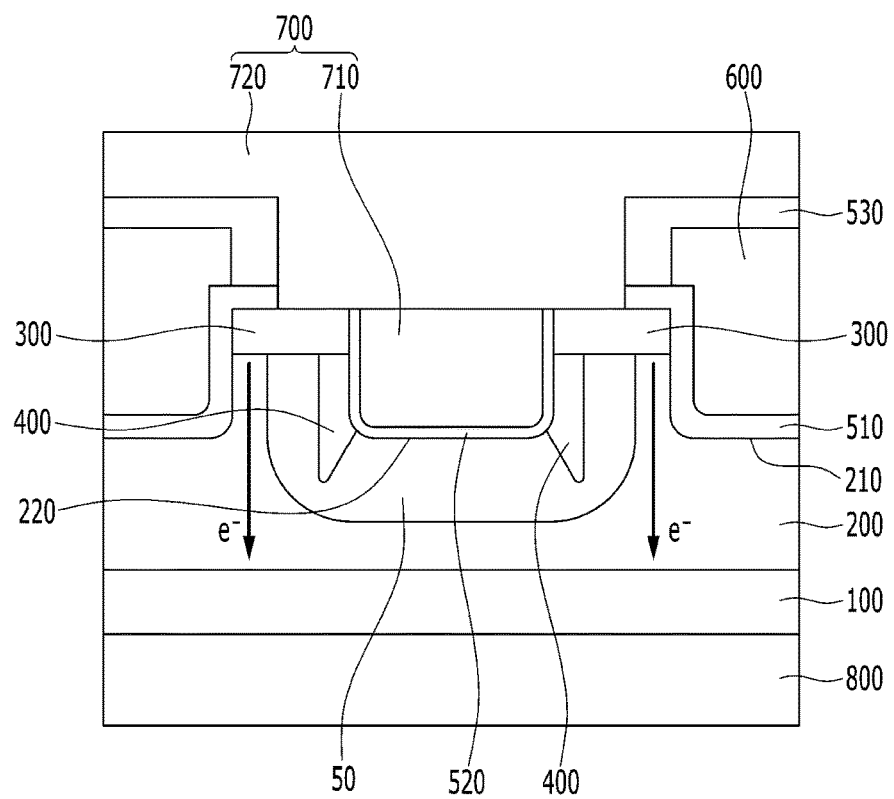
FIG. 5 is a view showing an operation state of a MOSFET of the semiconductor device shown in FIG. 1.
Figure 6:
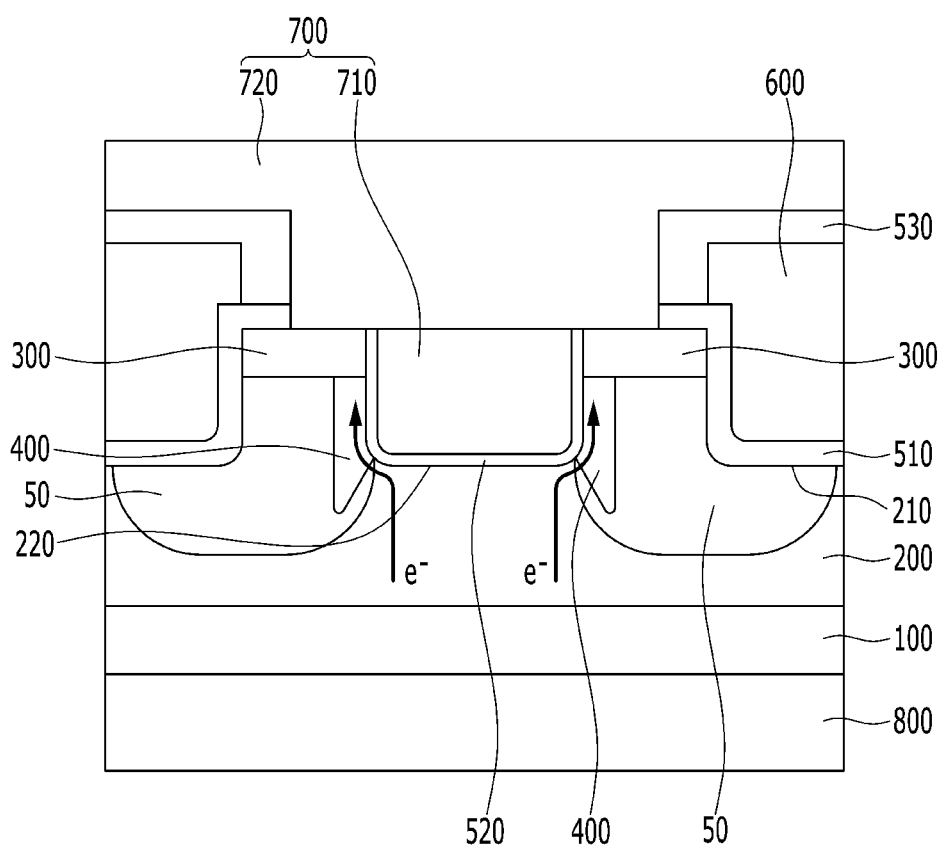
FIG. 6 is a view showing an operation state of the semiconductor device shown in FIG. 1.

FIGS. 4 to 6 are schematic views of the operation of the semiconductor device of FIG. 1.

FIG. 4 is a view showing an off state of the semiconductor device shown in FIG. 1. FIG. 5 is a view showing an operation state of a MOSFET of the semiconductor device shown in FIG. 1. FIG. 6 is a view showing an operation state of the semiconductor device shown in FIG. 1.

The off state of the semiconductor device is performed by a condition below.

$$V_{GS}<V_{TH}, V_{DS}\geq 0 \text{ V}$$

The operation of the MOSFET of the semiconductor device is performed by a condition below.

$$V_{GS}\geq V_{TH}, V_{DS}>0 \text{ V}$$

The operation state of the semiconductor device is performed by a condition below.

$$V_{GS}<V_{TH}, V_{DS}<0 \text{ V}$$

Here, $V_{TH}$ is a threshold voltage of the MOSFET, $V_{GS}$ is $V_G-V_S$, and $V_{DS}$ is $V_D-V_S$. $V_G$ is a voltage applied to the gate electrode, $V_D$ is a voltage applied to the drain electrode, and $V_S$ is a voltage applied to the source electrode.

Referring to FIG. 4, a depletion layer 50 is formed at the n− type layer 200 such that a flow of an electronic current is not generated in the off state of the semiconductor device. In this case, the depletion layer 50 is formed between the first trench 210 and the second trench 220, and under the second trench 220, and is disposed to cover the entire p type region 400.

Referring to FIG. 5, during the operation of the MOSFET of the semiconductor device, electrons (e−) migrate from the source electrode 700 to the drain electrode 800. Here, the electrons (e−) emitted from the source electrode 700 migrate to the drain electrode 800 through the n− type layer 200.

During the operation of the MOSFET of the semiconductor device, the depletion layer 50 is reduced by the voltage applied to the gate electrode 600. That is, the depletion layer 50 is formed under the second trench 220 and between the first trench 210 and the second trench 220 to cover the entire p type region 400, but is not formed at the side surface of the first trench 210. Accordingly, the electrons (e−) migrate to the side surface of the first trench 210.

Referring to FIG. 6, during the operation of the diode of the semiconductor device, the electrons (e−) migrate from the drain electrode 800 to the source electrode 700. The drain electrode 800 functions as a cathode and the source electrode 700 functions as an anode. Here, the electrons (e−) emitted from the drain electrode 800 migrate to the source electrode 700 through the n− type layer 200 and the p type region 400.

The channel is formed at the p type region 400 such that a moving path of the electrons (e−) is ensured during the operation of the diode of the semiconductor device. Here, the channel is an inversion layer channel. The depletion layer 50 is formed between the first trench 210 and the second trench 220, under the p type region 400, and under the first trench 210, but is not formed under the second trench 220. That is, the electrons (e−) migrate into the junction portion of the n− type layer 200 and the p type region 400 under the second trench 220.

As described above, the semiconductor device according to the present exemplary embodiment performs the operation of the MOSFET and the operation of the diode such that wiring connecting a conventional MOSFET element and a conventional diode element is not required. Accordingly, an area of the semiconductor device may be reduced.

Also, as the semiconductor device performs the operation of the MOSFET and the operation of the diode without the wiring, a switching speed of the semiconductor device may be improved and a loss of power may be reduced.

Next, the semiconductor device according to the present exemplary embodiment will be described with reference to Table 1 by comparing a characteristic of the general diode element and the general MOSFET element.

Table 1 represents a simulation result of the semiconductor device according to the present exemplary embodiment, and the general diode element and the general MOSFET element.

Comparative Example 1 is a general junction barrier Schottky (JBS) diode element, and Comparative Example 2 is the general MOSFET element. Comparative Example 3 is a general Schottky barrier diode (SBD) element.

In Table 1, a breakdown voltage of the semiconductor device according to the present exemplary embodiment and the semiconductor devices according to Comparative Example 1, Comparative Example 2, and Comparative Example 3 are controlled to be almost equal and a current density is compared.

TABLE 1

| | | Breakdown voltage (V) | Current density (A/cm$^2$) | Current carrying area (cm$^2$) @100 A |
|---|---|---|---|---|
| Comparative Example 1 | | 805 | 172.7 | 0.579 |
| Comparative Example 2 | | 808 | 794.9 | 0.126 |
| Comparative Example 3 | | 807 | 255.9 | 0.391 |
| Exemplary embodiment | Diode Operation | 813 | 259.8 | 0.385 |
| | MOSFET operation | | 899.5 | |

Referring to Table 1, the current carrying area for a current amount of 100 A appears as 0.579 cm$^2$ in the JBS diode element according to Comparative Example 1, and the MOSFET element according to Comparative Example 2 obtains the current carrying area of 0.126 cm$^2$. A sum of the current carrying areas for the current amount of 100 A of the semiconductor device according to Comparative Example 1 and Comparative Example 2 is 0.705 cm$^2$.

In the SBD element according to Comparative Example 3, the current carrying area for the current amount of 100 A appears as 0.391 cm$^2$ during the diode operation. The sum of the current carrying areas for the current amount of 100 A of the semiconductor device according to Comparative Example 2 and Comparative Example 3 is 0.517 cm$^2$.

In the case of the semiconductor device according to the exemplary embodiment, the current carrying area for the current amount of 100 A appears as 0.385 cm$^2$.

That is, as the current carrying area for the current amount of 100 A, it may be confirmed that the area of the semiconductor device according to the exemplary embodiment is reduced by 45.4% for the sum area of Comparative Examples 1 and 2. Also, it may be confirmed that the area of the semiconductor device according to the exemplary embodiment is reduced by 25.5% for the sum area of Comparative Examples 2 and 3.

Next, a manufacturing method of the semiconductor device according to FIG. 1 will be described with reference to FIGS. 7 to 11, as well as FIGS. 2 and 3.

FIGS. 7 to 11 are views showing one example of a manufacturing method of the semiconductor device according to FIG. 1.

Figure 7:
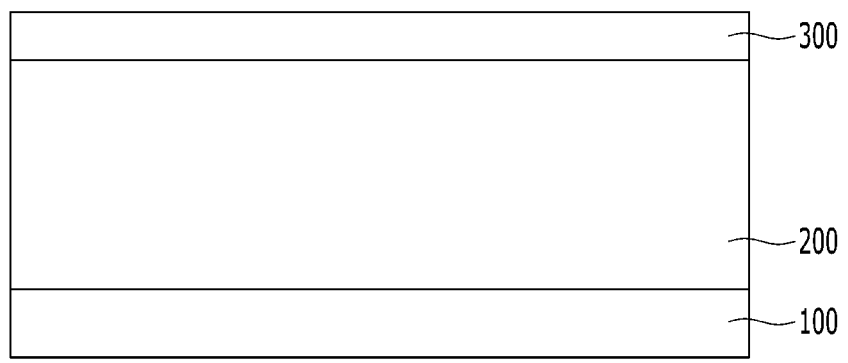
FIG. 7 to FIG. 11 are views showing one example of a manufacturing method of the semiconductor device of FIG. 1.

Referring to FIG. 7, after preparing an n+ type silicon carbide substrate 100 and forming an n− type layer 200 in a first surface of the n+ type silicon carbide substrate 100, an n+ type region 300 is formed on the n− type layer 200. The n− type layer 200 may be formed by epitaxial growth or n− ion injection. The n+ type region 300 may also be formed by the epitaxial growth or the n− ion injection.

Figure 8:
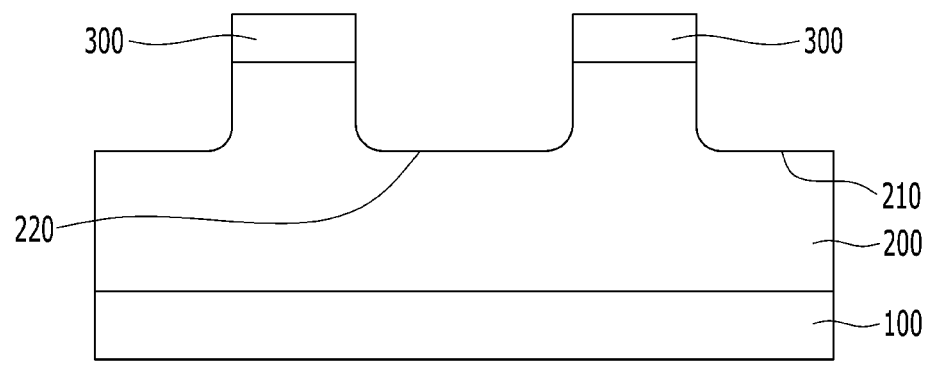

Referring to FIG. 8, the n+ type region 300 and the n− type layer 200 are etched to form a first trench 210 and a second trench 220. In this case, the first trench 210 and the second trench 220 are simultaneously formed.

Figure 9:
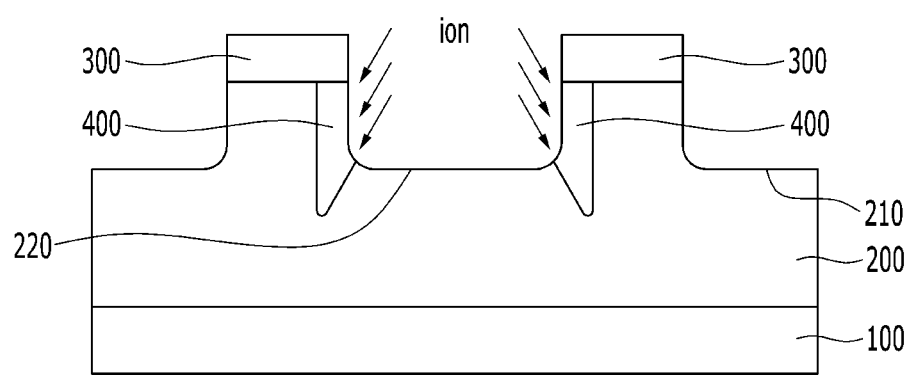

Referring to FIG. 9, a p type ion is injected to the side surface of the second trench 220 to form a p type region 400 between the side surface of the second trench 220 and the n− type layer 200. Accordingly, the p type region 400 encloses the corner of the second trench 220 and extends to the bottom of the corner of the second trench 220. On the other hand, the p type region 400 is not formed under the lower surface of the second trench.

In this case, the portion of the p type region 400 is positioned under the n+ type region 300 (referring to FIG. 2), and the other portion of the p type region 400 is positioned between the n+ type region 300 and the second trench 220 (referring to FIG. 3). Here, the p type ion is injected by a tilt ion injection method. The tilt ion injection method is an ion injection method in which an ion injection angle is smaller than a right angle with respect to the horizontal surface.

Figure 10:
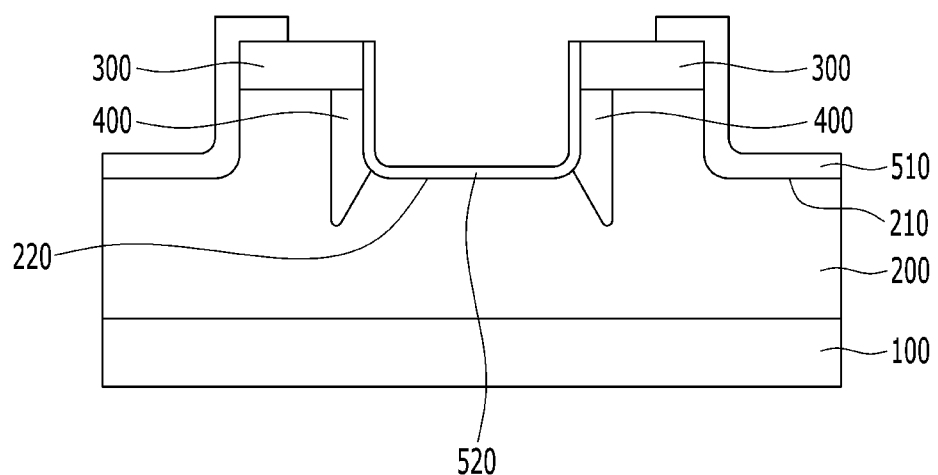

Referring to FIG. 10, a gate insulating layer 510 is formed within the first trench 210, and a source insulating layer 520 is formed within the second trench 220.

The materials of the gate insulating layer 510 and the source insulating layer 520 may be the same, and the thickness of the source insulating layer 520 may be thinner than the thickness of the gate insulating layer 510. However, it is not limited thereto, and the thickness of the source insulating layer 520 may be the same as the thickness of the gate insulating layer 510.

Figure 11:
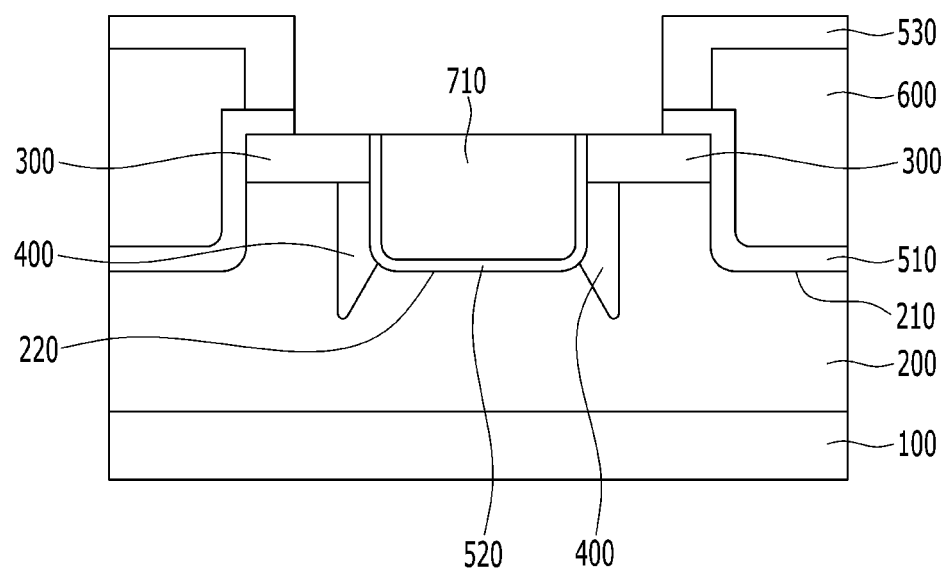

Referring to FIG. 11, a gate electrode 600 is formed on the gate insulating layer 510, and a first source electrode 710 is formed on the source insulating layer 520.

The gate electrode 600 fills the inside of the first trench 210 and may protrude to the upper side of the first trench 210. The gate electrode 600 may be formed of the polycrystalline silicon or the metal.

The first source electrode 710 fills the inside of the second trench 220 and may be formed of the polycrystalline silicon.

Next, an oxide layer 530 is formed on the gate electrode 600. The oxide layer 530 is formed to cover the side surface of the gate electrode 600 protruded from the first trench 210.

Referring to FIGS. 2 and 3, a second source electrode 720 is formed on the n+ type region 300, the portion of the p type region 400, the oxide layer 530, and the first source electrode 710, and a drain electrode 800 is formed at a second surface of the n+ type silicon carbide substrate 100. Here, the second source electrode 720 and the drain electrode 800 may be formed of the metal. In this case, the metal may be the ohmic metal.

In the present exemplary embodiment, the first source electrode 710 and the second source electrode 720 are formed of different materials in the manufacturing method of the semiconductor device, but it is not limited thereto, and the first source electrode 710 and the second source electrode 720 may be formed of the same metal material. In this case, the metal may be the ohmic metal. In this case, after forming the gate electrode 600 on the gate insulating layer 510 and forming the oxide layer 530 on the gate electrode 600, a source electrode 700 may be formed on the n+ type region 300, the portion of the p type region 400, the oxide layer 530, and the source insulating layer 520.

In the manufacturing method of the semiconductor device according to the present exemplary embodiment, the p type region 400 is formed after simultaneously forming the first trench 210 and the second trench 220, but the present disclosure is not limited thereto, and the p type region 400 may be formed and then the first trench 210 may be formed after firstly forming the second trench 220.

The semiconductor device according to the present exemplary embodiment includes the p type region 400, but the present disclosure is not limited thereto, and the p type region 400 may be omitted.

Next, the semiconductor device according to another exemplary embodiment in the present disclosure will be described with reference to FIG. 12.

Figure 12:
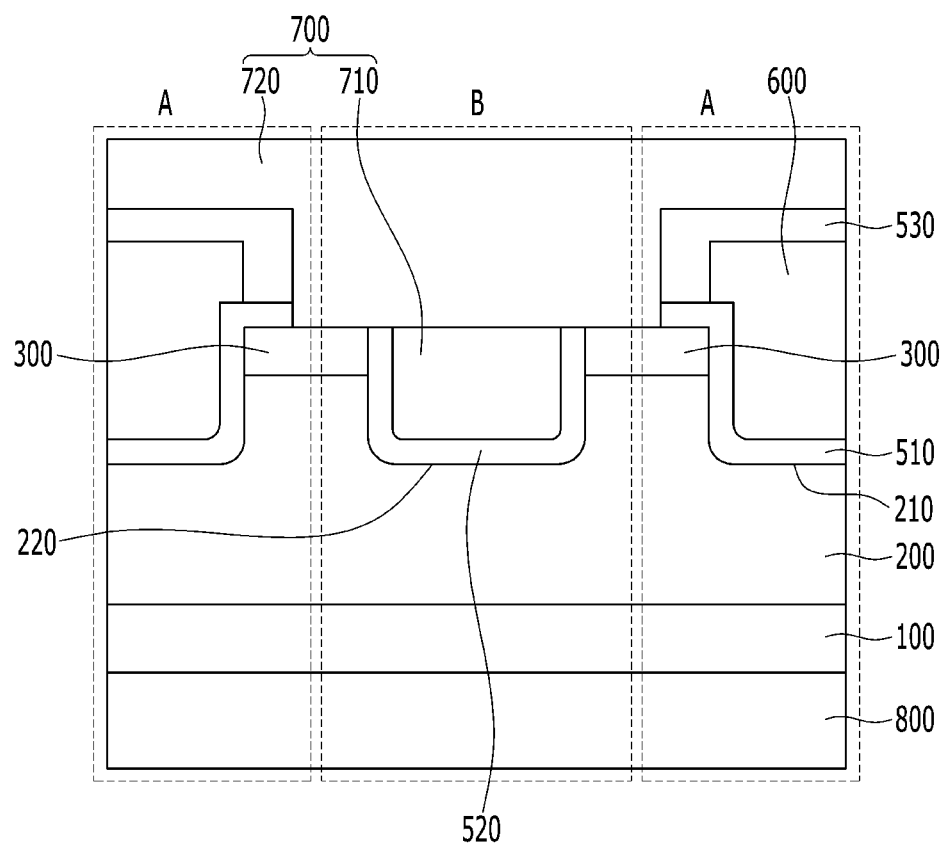
FIG. 12 is a cross-sectional view of one example of a semiconductor device according to another exemplary embodiment in the present disclosure.

FIG. 12 is a cross-sectional view of one example of a semiconductor device according to another exemplary embodiment in the present disclosure.

Referring to FIG. 12, the semiconductor device according to the present exemplary embodiment has the same structure as the semiconductor device shown in FIG. 1 except for omitting the p type region. Thereof, the description of the same structure is omitted.

The semiconductor device according to the present exemplary embodiment includes the MOSFET region A and the diode region B adjacent to each other.

The source electrode 700, the gate electrode 600, the n+ type region 300, the n− type layer 200, the n+ type silicon carbide substrate 100, and the drain electrode 800 form the MOSFET region A, and the source electrode 700, the n+ type region 300, the n− type layer 200, the n+ type silicon carbide substrate 100, and the drain electrode 800 form the diode region B.

In the semiconductor device according to the present exemplary embodiment, compared with the semiconductor device according to FIG. 1, the p type region is omitted such that the n− type layer 200 is disposed on both side surfaces of the second trench 220. The n+ type region 300 is disposed between the first trench 210 and the second trench 220 and is disposed on the n− type layer 200. The source electrode 700 is disposed on the n+ type region 300, the oxide layer 530, and the source insulating layer 520.

The thickness of the gate insulating layer 510 disposed within the first trench 210 may be the same as the thickness of the source insulating layer 520 disposed within the second trench 220.

The semiconductor device according to the present exemplary embodiment performs the MOSFET (metal oxide semiconductor field effect transistor) operation and the diode operation like the semiconductor device of FIG. 1.

The conditions of the off state of the semiconductor device according to the present exemplary embodiment, the MOSFET operation state, and the diode operation state are the same as the conditions of the semiconductor device according to FIG. 1.

However, compared with the semiconductor device of FIG. 1, the p type region is omitted such that the depletion layer 50 is formed between the first trench 210 and the second trench 220 and under the second trench 220 during the off state of the semiconductor device.

During the operation of the MOSFET of the semiconductor device, the depletion layer 50 is formed between the first trench 210 and the second trench 220 and under the second trench 220, but is not formed at the side surface and under the first trench 210. Accordingly, the electrons (e−) migrate into the drain electrode 800 from the source electrode 700 through the n− type layer 200 of the side surface of the first trench 210.

During the diode operation of the semiconductor device, the depletion layer 50 is formed between the first trench 210 and the second trench 220 and under the first trench 210, but is not formed at the side surface of the second trench 220 and under the second trench 220. Therefore, the electrons (e−) migrate from the drain electrode 800 to the source electrode 700 through the n− type layer 200 of the side surface of the second trench 220. That is, differently from the diode operation of the semiconductor device according to FIG. 1, the electrons (e−) migrate through the n− type layer 200 without the depletion layer, rather than the channel formed in the p type region 400.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A semiconductor device comprising:
an n− type layer disposed on a first surface of an n+ type silicon carbide substrate;
a first trench and a second trench formed in the n− type layer and separated from each other;
an n+ type region disposed between a side surface of the first trench and a side surface of the second trench and disposed on the n− type layer;
a p type region disposed on both side surfaces of the second trench;
a gate insulating layer disposed inside the first trench;
a source insulating layer disposed inside the second trench;
a gate electrode disposed on the gate insulating layer;
an oxide layer disposed on the gate electrode;
a source electrode disposed on the oxide layer, the n+ type region, and the source insulating layer; and
a drain electrode disposed on a second surface of the n+ type silicon carbide substrate.

2. The semiconductor device of claim 1, wherein the p type region is disposed between the side surface of the second trench and the n− type layer.

3. The semiconductor device of claim 2, wherein the p type region encloses a corner of the second trench and extends under the corner of the second trench.

4. The semiconductor device of claim 3, wherein the n+ type region is disposed on the n− type layer and a first portion of the p type region.

5. The semiconductor device of claim 4, wherein a second portion of the p type region is disposed between the n+ type region and the side surface of the second trench.

6. The semiconductor device of claim 5, wherein the source insulating layer and the gate insulating layer include the same material, and
a thickness of the source insulating layer is thinner than a thickness of the gate insulating layer.

7. The semiconductor device of claim 6, wherein the source electrode includes a first source electrode and a second source electrode,
the first source electrode is disposed on the source insulating layer, and
the second source electrode is disposed on the n+ type region, the portion of the p type region, the oxide layer, and the first source electrode.

8. The semiconductor device of claim 7, wherein the first source electrode and the gate electrode include a polycrystalline silicon, and
the second source electrode and the drain electrode include an ohmic metal.

9. The semiconductor device of claim 7, wherein the gate electrode includes the polycrystalline silicon, and
the first source electrode, the second source electrode, and the drain electrode include the ohmic metal.

10. The semiconductor device of claim 1, wherein the gate insulating layer and the source insulating layer include the same material, and
thicknesses of the gate insulating layer and the source insulating layer are the same.

11. A method for manufacturing a semiconductor device, comprising steps of:
forming an n− type layer on a first surface of an n+ type silicon carbide substrate;
forming an n+ type region on the n− type layer;
etching the n+ type region and the n− type layer to form a first trench and a second trench separate from each other;
forming a gate insulating layer within the first trench;
injecting a p type ion to the side surface of the second trench to form a p type region between the side surface of the second trench and the n− type layer;
forming a source insulating layer within the second trench;
forming a gate electrode on the gate insulating layer;
forming an oxide layer on the gate electrode;
forming a source electrode on the oxide layer, the n+ type region, and the source insulating layer; and
forming a drain electrode on a second surface of n+ type silicon carbide substrate,
wherein the p type region encloses a corner of the second trench and extends under the corner of the second trench.

12. The method of claim 11, wherein
a first portion of the p type region is formed under the n+ type region, and a second portion of the p type region is formed between the n+ type region and the side surface of the second trench.

13. The method of claim 12, wherein
in the step forming the p type region,
the p type ion is injected by a tilt ion injection method.

14. The method of claim 13, wherein
the source insulating layer and the gate insulating layer include the same material, and
the thickness of the source insulating layer is thinner than the thickness of the gate insulating layer.

15. The method of claim 14, wherein
the source electrode includes a first source electrode and a second source electrode,
the first source electrode is disposed on the source insulating layer, and
the second source electrode is disposed on the n+ type region, the portion of the p type region, the oxide layer, and the first source electrode.

16. The method of claim 15, wherein
the first source electrode and the gate electrode include a polycrystalline silicon, and
the second source electrode and the drain electrode include an ohmic metal.

17. The method of claim 15, wherein
the gate electrode includes the polycrystalline silicon, and
the first source electrode, the second source electrode, and the drain electrode include the ohmic metal.

* * * * *